(12) United States Patent
Gee et al.

(10) Patent No.: US 7,812,462 B2
(45) Date of Patent: Oct. 12, 2010

(54) CONDUCTIVE PATHS FOR TRANSMITTING AN ELECTRICAL SIGNAL THROUGH AN ELECTRICAL CONNECTOR

(75) Inventors: Stephen Gee, Danville, CA (US); Hau Nguyen, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 93 days.

(21) Appl. No.: 12/264,814

(22) Filed: Nov. 4, 2008

(65) Prior Publication Data

US 2010/0109167 A1    May 6, 2010

(51) Int. Cl.
*H01L 23/485* (2006.01)

(52) U.S. Cl. .................. 257/786; 257/E23.02

(58) Field of Classification Search ............. 257/738, 257/773, 775, 780, 786, E23.02; 438/612, 438/666

See application file for complete search history.

(56) References Cited

U.S. PATENT DOCUMENTS 6,960,828 B2 * 11/2005 Nair et al. ............... 257/734
7,208,843 B2 * 4/2007 Richling et al. .......... 257/784
7,253,528 B2 * 8/2007 Dauksher et al. ......... 257/775

\* cited by examiner

*Primary Examiner*—W. David Coleman
*Assistant Examiner*—Daniel Shook
(74) *Attorney, Agent, or Firm*—Beyer Law Group LLP

(57) ABSTRACT

The claimed invention relates to structures suitable for improving the performance and reliability of electrical connectors. One embodiment of the claimed invention includes an integrated circuit die having an electrical contact coupled with electrically conductive paths that share a common electrical source. The conductive paths are configured to transmit the same electrical signal to the electrical contact, which supports an electrical connector, such as a solder bump. The electrical connector couples the die with an outside component, such as a circuit board. Each of the conductive paths connect to the electrical contact at different interface locations. When the electrical signal passes through the interface locations, the paths are configured to have non-zero current densities at those locations. The electrical resistance of the conductive paths may be substantially similar. Thus, instead of being concentrated at a single point, current is more evenly distributed along the junction between the die and solder bump, which may reduce voiding and localized heating.

18 Claims, 5 Drawing Sheets

CONDUCTIVE PATHS FOR TRANSMITTING AN ELECTRICAL SIGNAL THROUGH AN ELECTRICAL CONNECTOR

TECHNICAL FIELD

The present invention relates generally to the packaging of integrated circuits. More particularly, the invention relates to the passage of current through an electrical connector and an integrated circuit die.

BACKGROUND

There are a number of conventional processes for packaging integrated circuits. Many packaging techniques position solder bumps onto associated bond pads formed on an active face of a die to provide electrical interconnects to external devices. The die is then typically attached to a suitable substrate, such as a printed circuit board (PCB), such that the solder bumps on the die are surface mounted to contact pads on the substrate. The solder bumps are then typically reflowed to form solder joint connections between the substrate and the attached die.

Various problems, such as electromigration failure, can occur when a solder bump is electrically connected to the bond pad of an integrated circuit die. If a portion of the solder bump maintains a very high current density for a prolonged period, localized heating and void nucleation may erode the stability and performance of the electrical connection.

FIG. 1A illustrates an example of this problem. FIG. 1A shows a side, cross-sectional view of conventional integrated circuit die 114 having wiring layer 116, underbump metallization (UBM) layer 104 and bond pad 108, which supports solder bump 102. In this example, electron flow 112, which represents a large fraction of the total current flowing through the solder bump, moves horizontally through wiring layer 116 and begins to move upward at the perimeter of solder bump 102.

Electron flow 112 tends to follow the least resistive path, which narrows to one small region along the perimeter of solder bump 102. This is also shown in FIG. 1B, which illustrates a top view of some of the structures in FIG. 1A, including solder bump 102 and wiring layer 116. Electron flow 112 concentrates at region 118 as it begins its ascent into solder bump 102, because region 118 constitutes the most direct path into the solder bump. Thus, the current density is many times higher at region 118 in comparison to other points on the perimeter of solder bump 102, producing heat and causing the metal ions of the solder to move in the direction of the electron flow 112. The subsequent breakdown of the solder degrades the electrical connection enabled by solder bump 102, eventually reducing the performance and reliability of a device containing the above structures.

Although existing approaches work well in many situations, there are ongoing efforts to further improve the design of integrated circuit devices, such that problems like those described above are minimized or eliminated.

SUMMARY

The invention relates to arrangements and structures for improving the performance and reliability of electrical connectors. One embodiment of the claimed invention involves an integrated circuit die having an electrical contact coupled to an electrical connector (e.g. a solder bump). There are multiple electrically conductive paths, which run through the die and connect the contact with an electrical source. The conductive paths are configured to transmit the same electrical signal to the electrical connector via the electrical contact. Each of the conductive paths connect to the electrical contact at different interface locations. When the electrical signal passes through the interface locations, the paths are configured to have uniform non-zero current densities at those locations. The electrical resistance of the conductive paths may be substantially similar or the same. Thus, instead of being concentrated at a single point, current is more evenly distributed along the junction between the die and the electrical connector, which may improve the longevity and performance of the electrical connection.

Conductive paths may be structured and arranged in a variety of ways. In some embodiments, the electrically conductive paths intersect the electrical contact along its periphery, entirely within its periphery, or both. There may be at least two sets of electrically conductive paths, each of which correspond to a separate set of interface locations. In such embodiments, one set of interface locations may have a different current density from another set. Interface locations with lower current densities may be situated near high stress regions of the electrical contact, such as its periphery.

Different sizes, types and combinations of electrically conductive paths are possible. In some embodiments, some conductive paths may be longer or wider than others. Paths may be slotted, made of different materials or take different shapes. Some paths may include one or more conductive layers and vias. In some embodiments, the paths include non-conductive sections. The above features may be configured to control the current density at a specific part of a conductive path and/or to adjust the electrical resistance of a conductive path.

BRIEF DESCRIPTION OF THE DRAWINGS

The invention and the advantages thereof, may best be understood by reference to the following description taken in conjunction with the accompanying drawings. In the drawings, like reference numerals are sometimes used to designate like structural elements. It should also be appreciated that the depictions in the figures are diagrammatic and not to scale.

DETAILED DESCRIPTION

The present invention relates generally to the packaging of integrated circuits. More particularly, the invention relates to arrangements for improving the passage of current from an integrated circuit device through an electrical connector.

As illustrated earlier in FIGS. 1A and 1B, a conventional integrated circuit die typically connects to an attached solder bump via a single conductive path. This architecture tends to cause the electron flow to concentrate at a single region of least resistance on the solder bump. Such a concentration may induce localized heating and voiding of the solder material.

An embodiment of the present invention relates to an integrated circuit die adapted to help minimize such problems. In this embodiment, the integrated circuit die has an electrical contact (e.g. a bonding pad) supporting an electrical connector, such as a solder bump. The solder bump in turn is coupled with an electrical component (e.g. a printed circuit board.) The die has multiple electrically conductive paths that intersect the contact at different interface locations. The electrically conductive paths are adapted to transmit the same electrical signal. The conductive paths are configured such that, when the electrical signal passes via the paths through the interface locations, the non-zero current density at those locations is similar. As a result, current is distributed more evenly across the electrical contact connecting the die to the electrical connector.

Figure 1B:
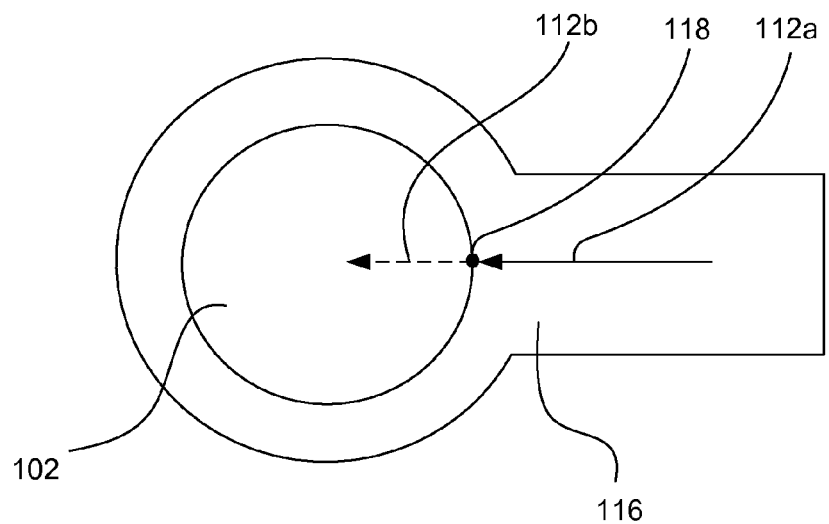
FIG. 1B is a top plan view of the integrated circuit die and solder bump illustrated in FIG. 1A.
Figure 2A:
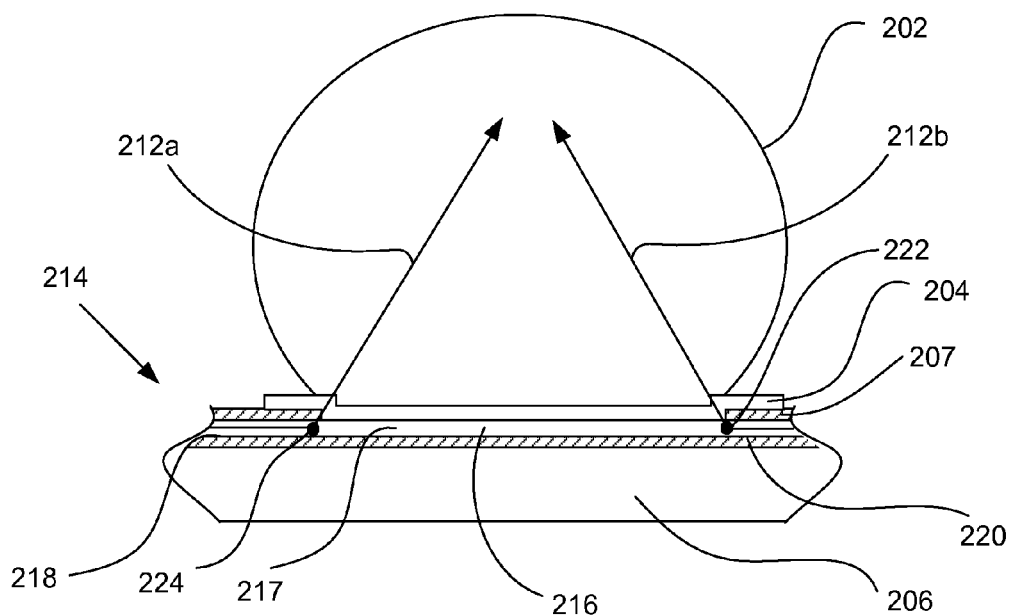
FIG. 2A is a side cross-sectional view of an integrated circuit die and a solder bump according to one embodiment of the present invention.

The above embodiment will be described with reference to FIG. 2A. FIG. 2A illustrates a side, cross-sectional view of integrated circuit device 214 having conductive layer 217, UBM (Under Bump Metallization) or other material conducting layer 204, silicon substrate 206, passivation or dielectric material 207 and electrical contact 216. Electrical contact 216 supports electrical connector 202. Two electrically conductive paths 218 and 220 intersect the electrical contact. Electron flows 212a and 212b, which represent the same electrical signal, run horizontally from the left and right respectively along paths 218 and 220 and, upon entering electrical contact 216, proceed upward at interface points 224 and 222 through electrical connector 202. In this embodiment, electrical contact 216 is the bonding pad of the integrated circuit device and electrical connector 202 is a solder bump, although other suitable structures may also be used. Unlike wiring layer 116 of FIG. 1B, which directs current into solder bump 102 from only one direction, conductive paths 218 and 220 of FIG. 2A bring electron flows 212a and 212b into conductive layer 217 and electrical contact 216 from two different directions.

Figure 1A:
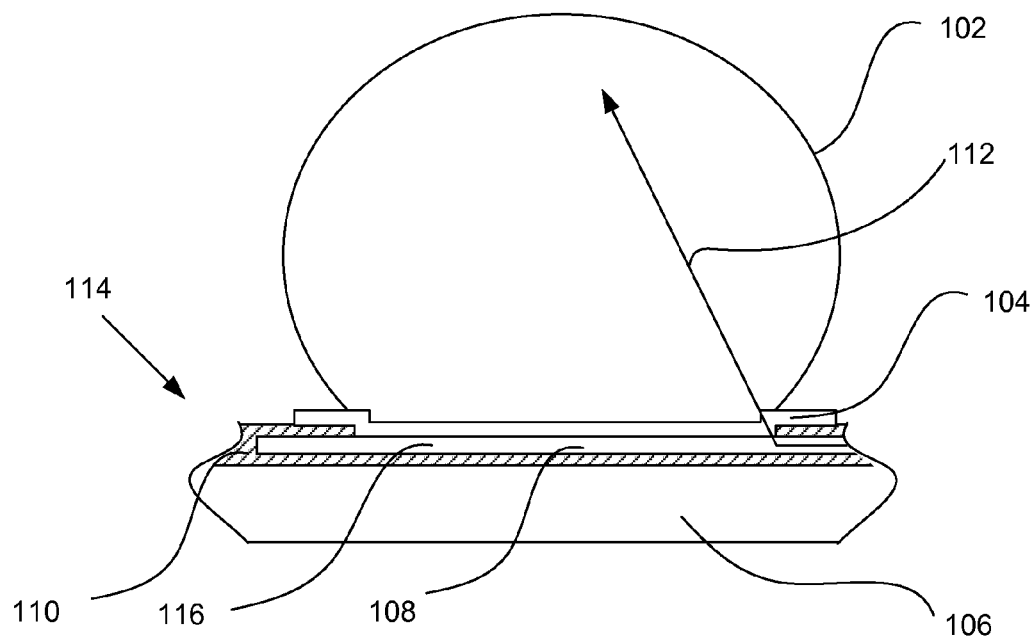
FIG. 1A is a side, cross-sectional view of an exemplary integrated circuit die and solder bump.
Figure 2B:
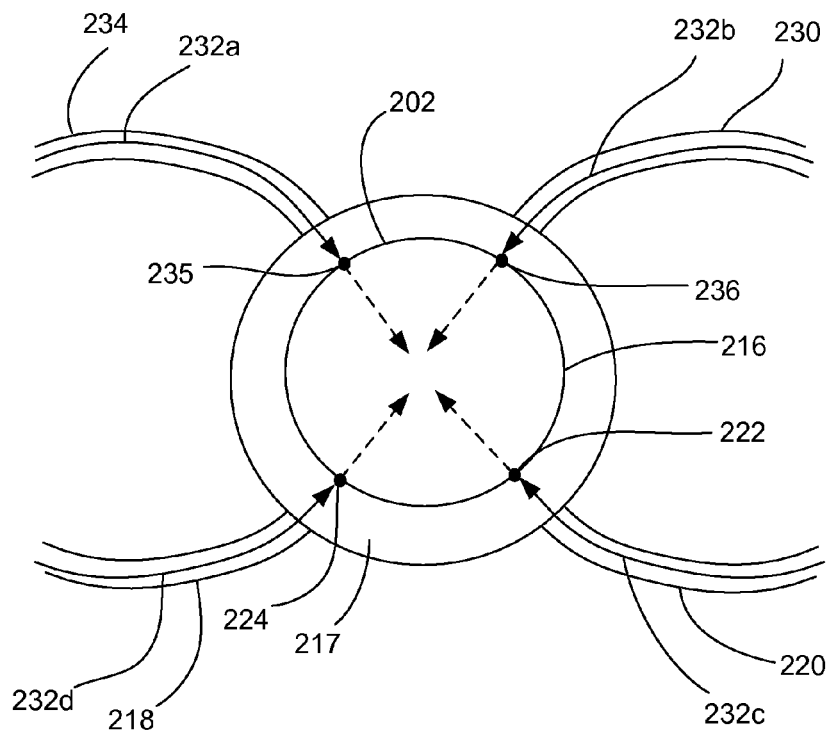
FIG. 2B is a top plan view of portions of an integrated circuit die and a solder bump according to one embodiment of the present invention.

FIG. 2B illustrates a top view of an alternative embodiment that is similar to the one illustrated in FIG. 1A in many respects. FIG. 2B, however, has four electron flows 232a-d that proceed through 4 distinct conductive paths 218, 220, 230 and 234. Accordingly, conductive paths 218, 220, 230 and 234 of FIG. 2B bring electron flows 232a-d into conductive layer 217 and electrical contact 216 from four different directions. Electron flows 232a-d enter electrical contact 216 of conductive layer 228 at interface points 224, 222, 236 and 235 and proceed upward (as denoted by the dotted arrows) through electrical connector 202. In the illustrated embodiment, the four conductive paths have equal electrical resistance and extend from a common electrical source. The current density at interface points 224, 222, 236 and 235 is approximately the same.

The embodiments illustrated in FIGS. 2A and 2B offer several benefits. Unlike the arrangements of FIGS. 1A and 1B, in which much of the current for a single electrical signal is concentrated in one small region, in FIGS. 2A and 2B current is distributed across multiple interface locations. By spreading out the current instead of concentrating it at a single point, localized heating and voiding may be reduced. The arrangement also dynamically responds to problems at one of the interface locations. If, for example, interface location 235 of FIG. 2B degrades, the electrical resistance of its corresponding conductive path 234 will increase relative to the other paths. Current density at interface location 235 will decline, thus lessening the rate of deterioration at that location. Electron flows will be diverted away from path 234 and toward paths 218, 220 and 230. This movement of current away from weakened links and toward stronger ones may improve the electrical performance and reliability of a device containing the above structures.

It should be appreciated that FIGS. 2A and 2B present only two possible arrangements of paths. A greater or lesser number of paths coming from various directions are possible. There could be, for example, thousands of paths and interface locations. FIGS. 2A and 2B show conductive paths that connect with the electrical contact only at its periphery. The paths, however, may intersect with the electrical contact at other locations as well.

Figure 3A:
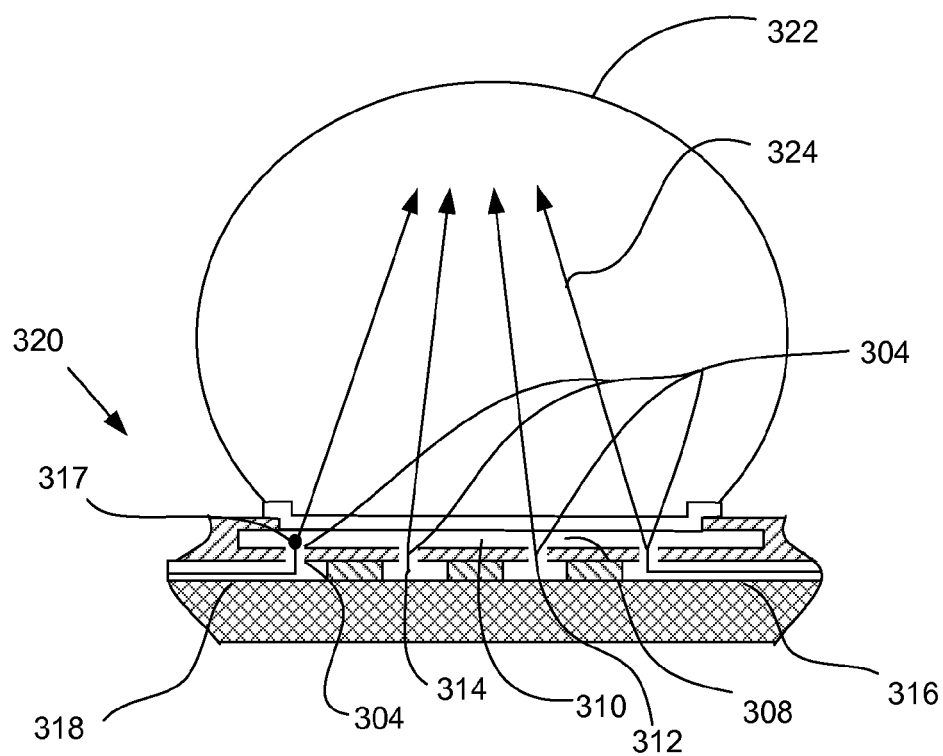
FIGS. 3A-3B are side cross-sectional and top plan views of an integrated circuit die and a solder bump according to another embodiment of the present invention.
Figure 3B:
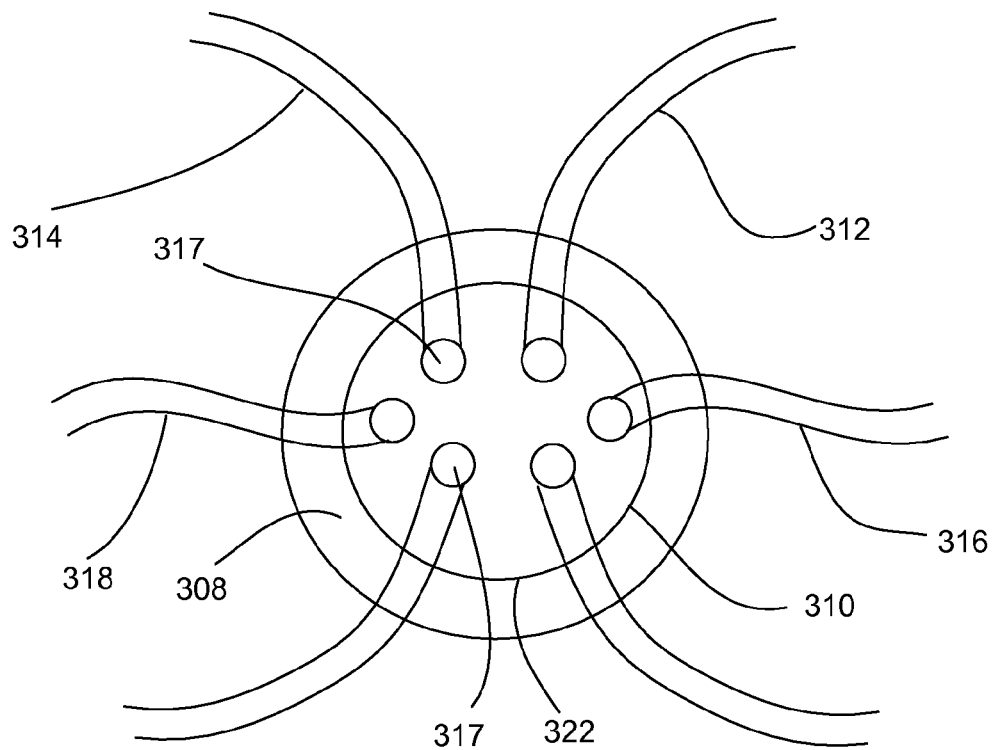

FIGS. 3A and 3B, for example, illustrate side and top views of an embodiment in which conductive paths intersect with the electrical contact entirely inside its periphery. FIGS. 3A and 3B show integrated circuit device 320 having conductive layer 308 and electrical contact 310, which supports electrical connector 322. In the illustrated embodiment, portions of conductive paths 318, 314, 312 and 316 are situated below conductive layer 308 and electrical contact 310. The paths carry electron flows 324, which represent the same electrical signal. As shown in FIG. 3A, electron flows 324 initially run laterally and below electrical contact 310. Vias 304 direct such electron flows up and into the underside of electrical contact 310 at interface locations 317. In this embodiment, the conductive paths 318, 314, 312 and 316 have similar amounts of electrical resistance. The interface locations 317 have similar current densities. This embodiment also distributes current more evenly across the electrical contact and may dynamically respond to the deterioration of a path or interface location.

There may be additional advantages in situating interface locations 317 inside the periphery of electrical contact 310, as shown in FIG. 3B. Different materials with different coefficients of thermal expansion often meet at the periphery of electrical contact 310. As a result, mechanical and thermal stresses may concentrate at such locations. If interface locations 317 are situated away from the periphery of electrical contact 310, electron flows 324 are less likely to be degraded by failure mechanisms associated with such stresses.

Interface locations may be arranged and structured in a variety of ways. Some embodiments involve interface locations both within and at the periphery of the electrical contact. The current density of one set of interface locations may be higher than that of another set of interface locations. In some embodiments, the current density of a set of interface locations depends on its proximity to a high-stress portion of the electrical contact, such as its periphery. Different current densities may be achieved by adapting the structure and arrangement of the paths and interface locations. The interface locations closer to such regions, for example, may be smaller than the ones that are further from them. Such modifications aim at distributing current over the surface area of the electrical contact while reducing current density at especially vulnerable portions of the electrical contact.

The conductive paths, interface locations, conductive layers and electrical contacts of FIGS. 3A and 3B may be configured in a number of different ways. There may be any number of paths, vias and conductive layers. Vias, conductive layers, interface locations and electrical contacts may assume a variety of shapes and be made of various materials. They, for example, may include non-conductive sections. Conductive paths may vary in height and width. They may be slotted and have different cross-sectional shapes, such as circular, square or oval.

Figure 4A:
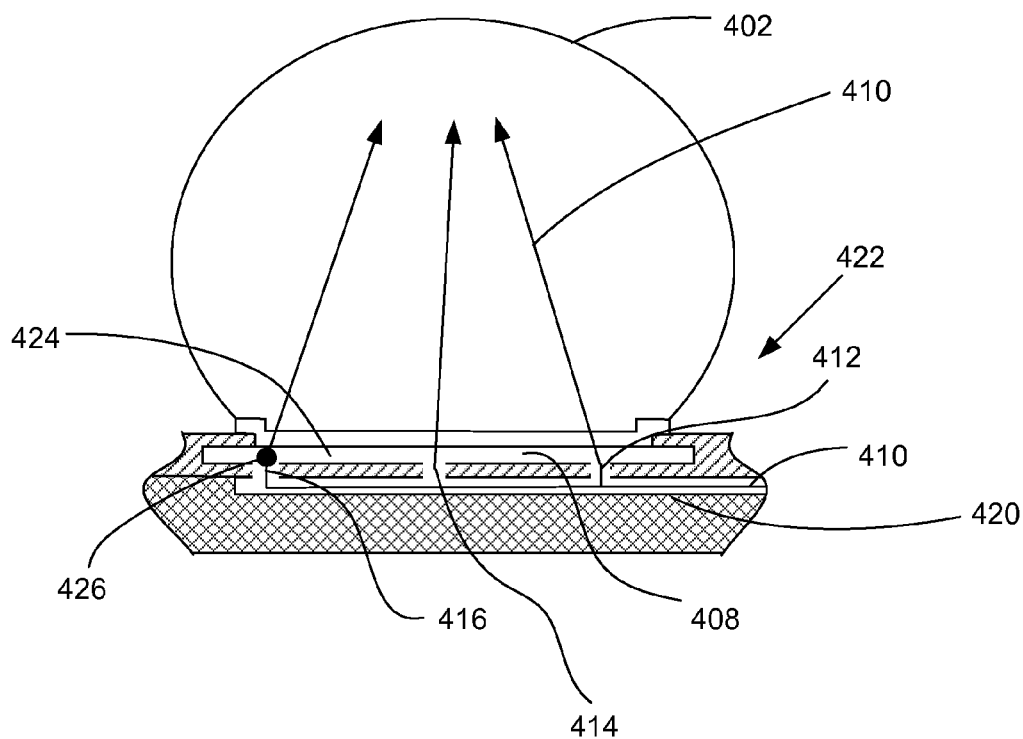
FIGS. 4A-4B are side cross-sectional and top plan views of an integrated circuit die and a solder bump according to another embodiment of the present invention.
Figure 4B:
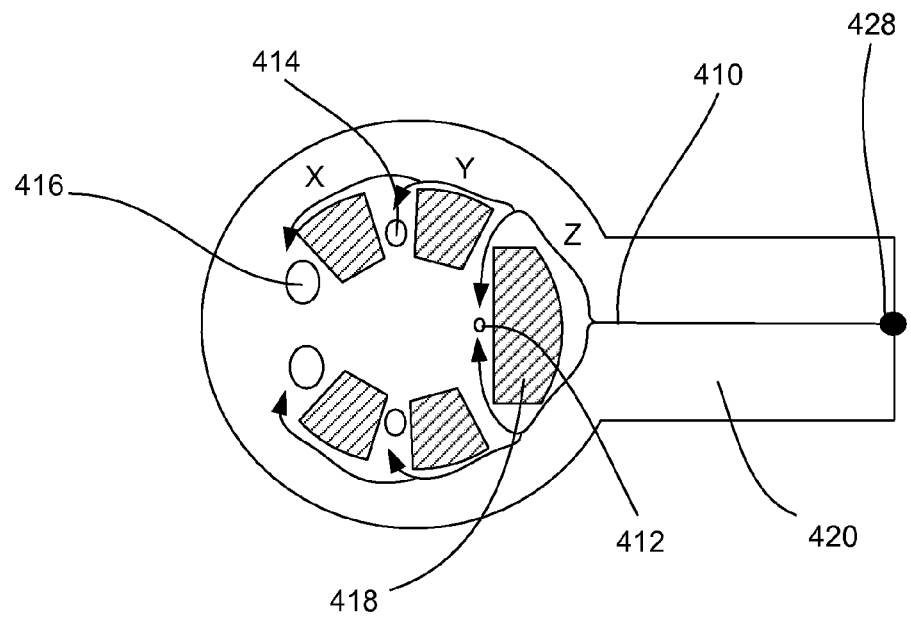

FIGS. 4A and 4B illustrate one embodiment including some of the above features. FIG. 4A illustrates a side view of integrated circuit device 422 having vias 416, 414 and 412, lower conductive layer 420, upper conductive layer 408, interface locations 426 and electrical contact 424, which supports electrical connector 402. Electron flow 410 runs laterally below electrical contact 424 and along bottom conductive layer 420. Vias 416, 414 and 412 direct the flow upward from lower conductive layer 420 to interface locations 426 on upper conductive layer 408.

FIG. 4B, which is a top view of some of the structures of FIG. 4A, illustrates possible effects of varying the size, shape and/or composition of the conductive layers and vias. FIG. 4B shows lower conductive layer 420 having non-conductive sections 418 (not shown in FIG. 4A), electron flow 410 and vias 412, 414 and 416. In the illustrated embodiment, point 428 represents a location on FIG. 4B that is closest to the electrical source for electron flow 410. Electron flow 410 runs leftward from point 428 and then splits (as indicated by the curved arrows) to meet vias 412, 414 and 416, which electrically connect lower conductive layer 420 to upper conductive layer 408 and interface locations 426 of FIG. 4A.

In the illustrated embodiment, the arrangement and size of the vias and the lower conductive layer are configured to equalize the current density at interface locations 426 of FIG. 4A. Via 416 is further from point 428 than via 412, indicating that via 416 is further from the electrical source of electron flow 410. To compensate for this distance and to encourage current to flow to via 416, via 416 is substantially larger than via 412. (It should be appreciated that these and other figures in this application are diagrammatic and are not drawn to scale.) Via 414, being of an intermediate size between vias 412 and 416, is situated an intermediate distance from point 428. Additionally, non-conductive sections 418 of lower conductive layer 418 are arranged to split electron flow 410, so as to further encourage the even distribution of current among vias 416, 414 and 412.

FIG. 4B presents an example of how paths of different lengths and types can be configured to have the same electrical resistance. In the illustrated embodiment of FIG. 4B, conductive paths X, Y and Z, which include portions of lower conductive layer 420 and vias 416, 414 and 412 respectively, have the same electrical resistance. In FIGS. 4A and 4B the vias are shown as being of different sizes. However, in processes in which via dimensions are fixed, via arrays at locations 416, 414 and 412 can also be scaled so that the number of fixed dimension vias can be adjusted to match the areas of the differently sized vias used to equalize the current flow.

Figure 5A:
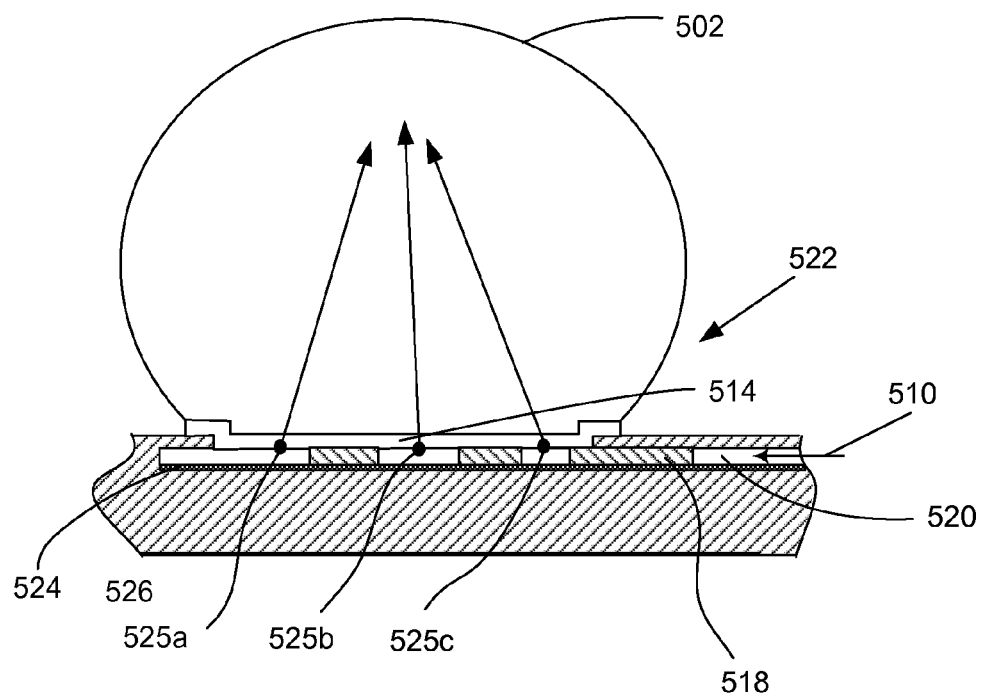
FIGS. 5A-5B are side cross-sectional and top plan views of an integrated circuit die and a solder bump according to another embodiment of the present invention.
Figure 5B:
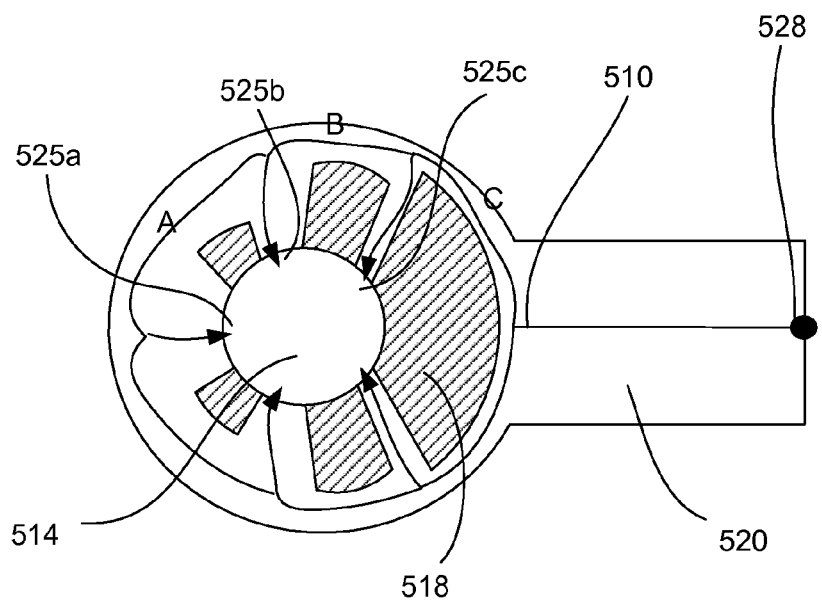

FIGS. 5A-5B illustrate an embodiment in which non-conductive sections can be shaped and arranged to help distribute current more evenly across a portion of a conductive layer. FIG. 5A presents a side view of integrated circuit device 522 having via 514 and lower conductive layer 520 which supports electrical connector 502. Lower conductive layer 520 contains non-conductive sections 518. Electron flow 510 runs below and around the perimeter of the via 514 through conductive layer 520. Via 514 directs the flow upward through resistance balanced channels 525a-c into electrical connector 502.

FIG. 5B, which is a top view of some of the structures of FIG. 5A, illustrates how non-conductive sections 518 in lower conductive layer 520 are arranged to define conductive paths A, B and C. Conductive paths A, B and C vary in length, as measured from point 528, which represents the closest point in FIG. 5B to the electrical source for electron flow 510, to via 514. Portions of the conductive paths also differ greatly in width. The inclusion of non-conductive sections or slots 518 in lower conductive layer 520 helps to control the width of portions of each conductive path. In the illustrated embodiment, the farther the conductive path extends from point 528, the wider the path becomes, generally speaking. For example, conductive path C is made of narrow "corridors" of conductive material hemmed in by non-conductive sections 518. Conductive path B is provided with a larger portion of conductive layer 520, and thus conductive path B includes corridors that are wider than those of conductive path C. Conductive path A includes corridors that are wider than those of paths B or C. The variation in the width of the conductive corridors for paths A, B and C helps to compensate for the variation in distances that the paths traverse. Because of this balancing, the current at interface regions 525a-c is substantially equal and the electrical resistance between paths A, B and C is substantially equal. It should be appreciated that if non-conductive sections 518 were removed, current in the illustrated embodiment may be distributed unevenly among interface regions 525a-c and concentrate in one region in a manner similar to region 118 of FIG. 1B.

The electrical resistance of a path may be adjusted in a variety of other ways as well. Paths, for example, in addition to varying in width or length, may also vary in shape or be slotted in different ways. Portions of paths may be made of different materials, for example a higher resistance material layer 524 may also be fabricated above or below the conductive layer 520, so as to facilitate current redistribution and balancing around the insulating layers 518. In some embodiments, the dimensions and characteristics of vias, non-conductive sections, conductive paths and/or other features may be adjusted to distribute current more evenly across a portion of a conductive layer.

In other embodiments, not all of the conductive paths have the same electrical resistance. For example, some paths that intersect the electrical contact at its periphery or other high stress regions may have a higher electrical resistance than paths that intersect the contact at a location farther from such regions.

Although only a few embodiments of the invention have been described in detail, it should be appreciated that the invention may be implemented in many other forms without departing from the spirit or scope of the invention. Therefore, the present embodiments should be considered as illustrative and not restrictive and the invention is not limited to the details given herein, but may be modified within the scope and equivalents of the appended claims.

What is claimed is:

1. An apparatus, comprising:
   an integrated circuit die having a first electrical contact adapted to provide a single electrical signal therethrough;
   an electrical connector coupled to said first electrical contact and adapted to provide an electrical connection from said integrated circuit die through said first electrical contact to an outside component; and
   a first plurality and a second plurality of electrically conductive paths connected to an electrical source and the first electrical contact, the first and second pluralities of electrically conductive paths adapted to provide the same electrical signal simultaneously to the first electrical contact, wherein:
   each of said first plurality of electrically conductive paths connects to a different interface location on the periphery of the first electrical contact;

each of said second plurality of electrically conductive paths connects to a different interface location substantially away from and within the periphery of the first electrical contact;

each of said first and second pluralities of electrically conductive paths is configured to have a non-zero current density when said same electrical signal passes therethrough; and the current density at the interfaces of the first plurality of electrically conductive paths is substantially less than at the interfaces of the second plurality of electrically conductive paths, there being no other electrically conductive paths that connect directly to the periphery of the first electrical contact other than the first plurality of electrically conductive paths.

2. An apparatus, comprising:

an integrated circuit die having a first electrical contact adapted to provide a single electrical signal therethrough;

an electrical connector coupled to said first electrical contact and adapted to provide an electrical connection from said integrated circuit die through said first electrical contact to an outside component;

a lower conductive layer that underlies said first electrical contact and that is connected to said first electrical contact through a plurality of vias, said plurality of vias including a first set of one or more vias and a second set of one or more vias, said first set of vias coming in contact with said first electrical contact at a first set of one or more interface locations, the second set of vias coming in contact with said first electrical contact at a second set of one or more interface locations; and a plurality of electrically conductive paths that connect an electrical source in said die to said first electrical contact, said plurality of electrically conductive paths adapted to provide said electrical signal simultaneously to said first electrical contact, said plurality of electrically conductive paths including a first set of one or more electrically conductive paths and a second set of one or more electrically conductive paths, said first set of electrically conductive paths extending through said lower conductive layer and said first set of vias and terminating at said first set of interface locations, said second set of electrically conductive paths extending through said lower conductive layer and said second set of vias and terminating at said second set of interface locations, wherein:

each of said plurality of electrically conductive paths is configured to have a non-zero current density when said electrical signal passes therethrough;

said first set of vias are situated substantially further away from said electrical source than said second set of vias; and said first set of electrically conductive paths has an electrical resistance that is substantially equal to an electrical resistance of said second set of electrically conductive paths.

3. An apparatus, comprising:

an integrated circuit die having a first electrical contact adapted to provide a single electrical signal therethrough;

an electrical connector coupled to said first electrical contact and adapted to provide an electrical connection from said integrated circuit die through said first electrical contact to an outside component;

a lower conductive layer that underlies said first electrical contact and that is connected to said first electrical contact through a plurality of vias, said plurality of vias including a first via and a second via; and a plurality of electrically conductive paths that connects an electrical source in said die to said first electrical contact and that extends through said plurality of vias and said lower conductive layer; said plurality of electrically conductive paths adapted to provide said electrical signal simultaneously to said first electrical contact, wherein:

each of said plurality of electrically conductive paths is configured to have a non-zero current density when said electrical signal passes therethrough;

said first via is situated substantially further away from said electrical source than said second via; and a cross-sectional area of said first via is substantially larger than a cross-sectional area of said second via.

4. The apparatus of claim 1, wherein some of the first plurality of conductive paths are slotted.

5. The apparatus of claim 1, wherein the first plurality of conductive paths includes a first set of conductive paths and a second set of conductive paths and wherein the first set of conductive paths are longer than the second set of conductive paths.

6. The apparatus of claim 1, wherein the first plurality of conductive paths includes a first set of conductive paths and a second set of conductive paths and wherein the first set of conductive paths are wider than the second set of conductive paths.

7. The apparatus of claim 1, wherein at least some of the interface locations have different sizes.

8. The apparatus of claim 1, wherein the first plurality of conductive paths have the same electrical resistance.

9. The apparatus of claim 1, wherein at least one of the interface locations that is further from the electrical source is larger than the at least one of the interface locations that is closer to the electrical source.

10. The apparatus of claim 1, wherein the electrical connector is a solder bump.

11. The apparatus of claim 1, wherein the outside component is a printed circuit board.

12. The apparatus of claim 1, wherein the apparatus further comprises:

a first conductive layer including the electrical contact; and a second conductive layer, the first and second conductive layers coupled with the conductive paths, each conductive path forming a via between the first conductive layer and the second conductive layer.

13. The apparatus of claim 12, wherein the vias have different diameters.

14. The apparatus of claim 12, wherein the first conductive layer surrounds at least one electrically non-conductive section.

15. The apparatus of claim 2, wherein each via of the first set of vias has a cross-sectional area that is greater than a cross-sectional area of any via of the second set of vias.

16. The apparatus of claim 2, wherein each via of the first set of vias has a cross-sectional area that is substantially the same as a cross-sectional area of any via of the second set of vias.

17. The apparatus of claim 2, wherein said lower conductive layer includes non-conductive sections situated away from and within the periphery of the lower conductive layer and wherein the non-conductive sections help to define said plurality of electrically conductive paths.

18. The apparatus of claim 16, wherein:

the first set of vias is arranged in a first array;

the second set of vias is arranged in a second array;

a total cross-sectional area of the first set of vias is greater than a total cross-sectional area of the second set of vias.

* * * * *